(12) United States Patent
Soejima

(10) Patent No.: US 7,202,108 B2
(45) Date of Patent: Apr. 10, 2007

(54) SEMICONDUCTOR WAFER, SEMICONDUCTOR CHIP AND METHOD FOR MANUFACTURING THE SAME

(75) Inventor: Koji Soejima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 16 days.

(21) Appl. No.: 11/079,383

(22) Filed: Mar. 15, 2005

(65) Prior Publication Data

US 2005/0230840 A1 Oct. 20, 2005

(30) Foreign Application Priority Data

Mar. 31, 2004 (JP) ............................. 2004-106331

(51) Int. Cl.
*H01L 21/00* (2006.01)
(52) U.S. Cl. ............... 438/113; 438/114; 257/E21.599; 257/25.012; 257/25.026
(58) Field of Classification Search ................ 438/113, 438/114; 257/E21.599, E25.012, E25.026
See application file for complete search history.

(56) References Cited

U.S. PATENT DOCUMENTS

| 6,221,751 B1 * | 4/2001 | Chen et al. ................. 438/612 |
| 6,326,689 B1 * | 12/2001 | Thomas ...................... 257/734 |
| 6,589,815 B1 * | 7/2003 | Matsuoka et al. .......... 438/113 |
| 2005/0095750 A1 * | 5/2005 | Lo et al. ..................... 438/114 |

FOREIGN PATENT DOCUMENTS

| JP | 62-171137 | 7/1987 |
| JP | 2002-093752 | 3/2002 |

* cited by examiner

*Primary Examiner*—Trung Dang
(74) *Attorney, Agent, or Firm*—Foley & Lardner LLP

(57) ABSTRACT

In a semiconductor device, in which an insulating layer is disposed on the main face of the silicon substrate, and the insulating layer includes the protruding portion that protrudes from the end face of the silicon substrate, the protruding portion has an interconnect of Cu embedded within the insulating layer.

12 Claims, 13 Drawing Sheets

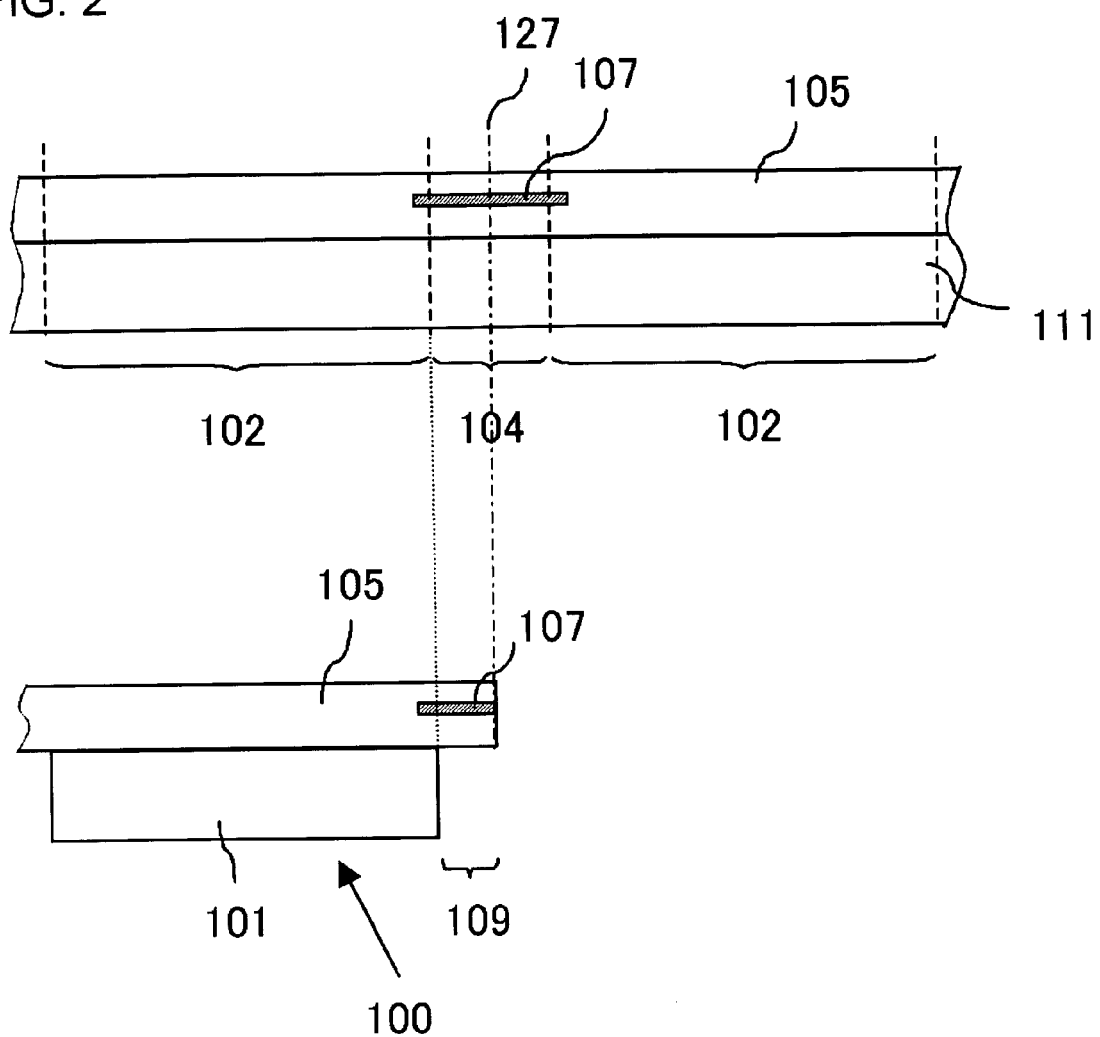

SEMICONDUCTOR WAFER, SEMICONDUCTOR CHIP AND METHOD FOR MANUFACTURING THE SAME

The present application is based on Japanese Patent Application NO. 2004-106331, the content of which is incorporated hereinto by reference.

BACKGROUND OF THE INVENTION

1. Field of the Invention

The present invention relates to a semiconductor wafer, a semiconductor chip and a method for manufacturing of the semiconductor device and the semiconductor wafer.

2. Related Art

Dicing process and etching process have conventionally been employed as methods for dividing a plurality of semiconductor devices formed on a wafer into individual devices. Such kind of technique is disclosed in Japanese Patent Laid-Open No. 2002-93,752. In the method disclosed in Japanese Patent Laid-Open No. 2002-93,752, a surface of a wafer formed circuit is first adhered onto a tape component. A back surface of the wafer is ground while maintaining such condition, thereby thinning the wafer. Then, resist layers are formed in regions corresponding to the individual semiconductor devices on the ground back surface, and an etching is performed from the side of the back surface to divide the wafer into individual semiconductor devices. It is described that the available regions for being employed as semiconductor elements in the wafer can be increased by employing this process. It is also described that cracks on the wafer generated during the back grinding can be removed to provide the process for improving the reliability after the packaging.

On the other hand, a configuration having a plurality of LSIs on a wafer, which are mutually connected with interconnects, is disclosed in Japanese Patent Laid-Open No. S62-171,137 (1987). It is described that a plurality of LSIs can be simultaneously inspected by having the configuration comprising the interconnects formed between the LSIs.

SUMMARY OF THE INVENTION

However, when the plurality of semiconductor devices on the wafer are required to be mutually connected by the interconnects, as in the case for the purpose of conducting inspections described in, for example, Japanese Patent Laid-Open No. S62-171,137, the interconnects could have been remained in the cut region in the dicing process. In this case, it is required that the remaining interconnects should be surely cut and that the short circuit or the like caused by the cut interconnects should be avoided, when the wafer is divided into a plurality of semiconductor chips by the dicing process. However, the removal of the interconnect is difficult to be carried out with the etching of the wafer, if the interconnects exist in the dicing region. Further, while the mechanical breaking of the interconnects is possible by the dicing, the interconnect may be pulled out by the cutting-off process, such that the interconnect is protruded from the cut face. On this account, there has been a concern that the reliability of the semiconductor device may be decreased by occurring the contact of the protruded interconnect with the semiconductor substrate to generate a defect.

According to the present invention, there is provided a semiconductor wafer comprising: a semiconductor substrate; and an insulating film provided on a main face of the semiconductor substrate, wherein a plurality of element regions and a dicing region are provided on the main face, the dicing region providing an isolation between the plurality of element regions and comprising an interconnect that connects one element region with other element region, and wherein the semiconductor substrate is removed on the dicing region and the dicing region comprises at least a portion of the insulating film.

According to the configuration of the present invention, the interconnect in the dicing region can surely be broken by a mechanical stress, since the semiconductor substrate wafer is thinned in the dicing region. Further, since a portion of the insulating film having the interconnect is remained while removing semiconductor substrate in the dicing region, the configuration of forming a protruding portion by protruding the insulating film from the end face of the semiconductor substrate can be achieved. Thus, the configuration provides inhibiting the contact of the interconnect to the semiconductor substrate after the chips are divided.

Here in the present invention, the semiconductor substrate is not necessarily completely removed and may substantially be removed in the dicing region. The term "substantially be removed" indicates a situation where the semiconductor substrate is removed in such level that the semiconductor wafer is broken in the dicing region when a stress along the surface orientation is exerted onto the semiconductor wafer.

In the present invention, the semiconductor wafer may have a configuration, in which the interconnect can be provided within the insulating film in the dicing region. In addition, the interconnect may be, for example, formed from one element formation region though the other element formation region that is adjacent to the element formation region.

The semiconductor wafer according to the present invention may have a configuration, in which a conductive plug is provided in the insulating film in the dicing region. Having such configuration, dicing can further surely be conducted even if the interconnect is provided in the dicing region.

The semiconductor wafer according to the present invention may have a configuration, in which plurality of the conductive plug are provided to form an array along the dicing region. Having such configuration, breaking of the semiconductor wafer at a predetermined position can be surely achieved.

The semiconductor wafer according to the present invention may have a configuration, in which a width of the dicing region is equal to or larger than 2 μm. Having such configuration, dicing process can more stably be carried out. In addition, the configuration comprising the insulating film, which protrudes from the end face of the semiconductor substrate to form the protruding portion, is assured to be achieved.

According to the present invention, there is provided a semiconductor chip, wherein the semiconductor chip is provided by dividing the semiconductor wafer according to the present invention in the dicing region.

According to the configuration, the removal of the semiconductor substrate in the dicing region provides a configuration, in which the inside of the insulating film is protruded outward from the periphery edge of the semiconductor substrate. Therefore, the configuration provides inhibiting the contact between the interconnect and the semiconductor substrate. Thus, the configuration provides improved manufacturing stability and reliability.

According to the present invention, there is provided a semiconductor chip, comprising: a semiconductor substrate; and an insulating film provided on the main face of the semiconductor substrate, wherein the insulating film includes a protruding portion, which protrudes toward outside beyond a periphery edge of the semiconductor substrate, and wherein an interconnect is included within an interior of the protruding portion.

The configuration have a shape, in which the insulating film protrudes outwards from a center of the semiconductor substrate, or in other words, semiconductor chip has an eaves-shaped protruding portion that substantially consists of the insulating film. Therefore, the configuration inhibits the contact of the protruded interconnect to the semiconductor substrate even if the interconnect protrudes from the end face of the protruding portion. Thus, the configuration inhibits the defects such as the generation of leakage current caused by the contact between the interconnect and the semiconductor substrate, thereby providing improved reliability.

The semiconductor chip may have a configuration, in which the protruding portion protrudes from the periphery edge of the semiconductor substrate by equal to or larger than 1 µm. Having such configuration, reliability of the semiconductor chip can be further improved.

According to the present invention, there is provided a method for manufacturing a semiconductor wafer, comprising: forming an interconnect layer on a main face of a semiconductor substrate, the interconnect layer including an interconnect and an insulating film, and the interconnect being embedded within the insulating film; fixing the side of the main face of the semiconductor substrate onto a support substrate; and selectively thinning a predetermined region within a region that the interconnect is provided from a side of a back surface of the semiconductor substrate while fixing the side of the main face of the semiconductor substrate onto a support substrate to form a dicing region.

According to the configuration, the thinned dicing region is formed, so that the configuration that enables the stable dicing in the region the interconnect is disposed can be provided. In addition, the semiconductor wafer that provides the semiconductor chips having the configuration of comprising the insulating film, which protrudes from the end face of the semiconductor substrate to form the protruding portion, can be stably manufactured.

In the method of the present invention, forming the interconnect layer may further include embedding a conductive plug within the insulating film in the dicing region. Having such process, breaking the interconnect layer at a predetermined position can be stably achieved. In addition, the conductive plug can be manufactured without the need for conducting an additional process, since the conductive plug can be formed simultaneously with forming the connecting plug in the element formation region Therefore, simple and easy process can be presented.

In the method of the present invention, embedding the conductive plug may further include forming plurality of the conductive plug along the dicing region. Having such process, breaking the interconnect layer at a predetermined position can further surely be achieved.

According to the present invention, there is provided a method for manufacturing a semiconductor chip, comprising: providing a semiconductor wafer by the method for manufacturing the semiconductor wafers according to the present invention; joining the back surface of the semiconductor substrate to a dicing sheet; removing the support substrate from the main face of the semiconductor substrate that is joined to the dicing sheet; and dividing the semiconductor wafer into a plurality of semiconductor chips by exerting stress to the semiconductor wafer to break the semiconductor wafer in the dicing region.

According to the method, the semiconductor wafer is broken by extending the dicing sheet, and thus a plurality of semiconductor chips can be obtained with a simple process. In addition, when the interconnect is protruded from the end face of the interconnect layer in case of breaking, contact of the protruded interconnect with the semiconductor substrate can be avoided. Therefore, the semiconductor chip having improved reliability can be surely obtained.

In the present invention, the semiconductor wafer is joined to the dicing sheet after the dividing the semiconductor wafer with the condition of being removable from the dicing sheet.

The method according to the present invention, dividing the semiconductor wafer into a plurality of semiconductor chips by exerting stress may include extending the dicing sheet. Having such process, the silicon wafer can more surely be broken in the dicing region with a simple process.

As have been described above, according to the present invention, the technique for improving the reliability of the semiconductor device having the interconnect layer in the dicing region can be achieved by providing the configuration that comprises the insulating film having the shape of protruding from the end face of the semiconductor substrate outwards and also comprises the interconnect within the protruding portion.

BRIEF DESCRIPTION OF THE DRAWINGS

The above and other objects, advantages and features of the present invention will be more apparent from the following description taken in conjunction with the accompanying drawings, in which:

FIG. 2 is a cross sectional view describing the process for manufacturing the semiconductor device shown in FIG. 1;

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in reference to the annexed figures. In all figures, identical numeral is assigned to an element commonly appeared in the figures, and the detailed description thereof is not presented in the following descriptions. In addition, in the following embodiments, the side of the main face of the silicon wafer or the silicon substrate is defined as "top", "front" or "principal", and the surface of the opposite side of the main face (back surface) is defined as "bottom" or "back".

(First Embodiment)

Figure 1A:
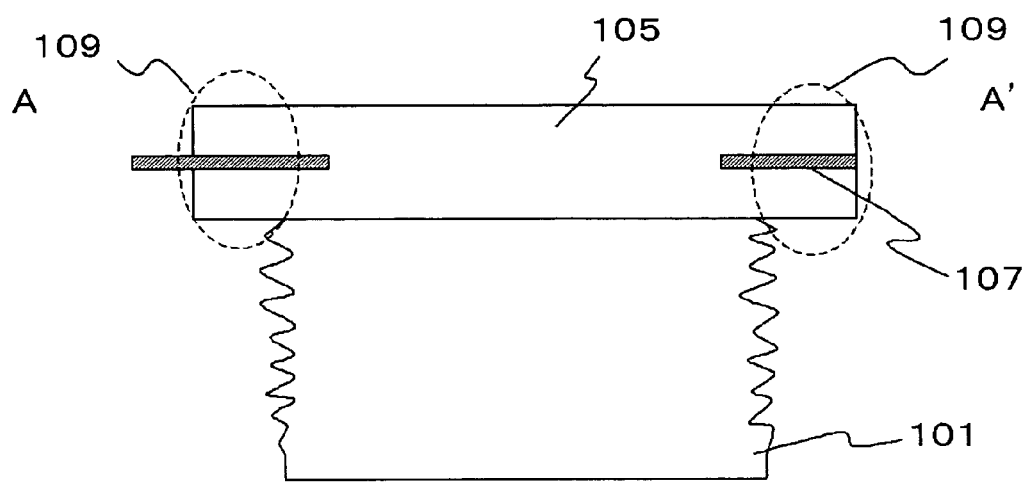
FIG. 1A is a cross-sectional view of a semiconductor device according to a first embodiment.
Figure 1B:
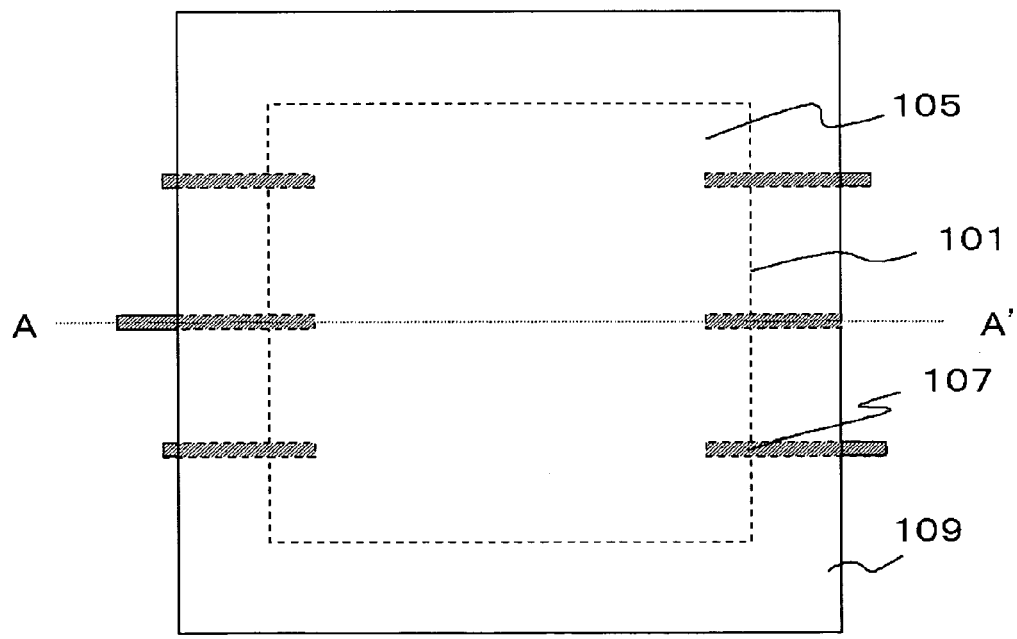
FIG. 1B is a plan view of the semiconductor device according to the first embodiment.

FIG. 1A and FIG. 1B are schematic views, showing a configuration of a semiconductor device according to a first embodiment. FIG. 1A is a cross-sectional view of a semiconductor device 100, and FIG. 1B is plan view of the semiconductor device 100. FIG. 1A shows a cross section along line A–A' shown in FIG. 1B. As shown in FIG. 1A and FIG. 1B, the semiconductor device 100 has a configuration of having an insulating layer 105 provided on a main face of a silicon substrate 101. A silicon oxide film may be formed on the main face of the silicon substrate 101, and the insulating layer 105 may be provided on the surface of the silicon oxide film. The insulating layer 105 is a multilayered body of a plurality of insulating films, and comprises an interconnect layer. The interconnect layer includes an interconnect 107 of Cu embedded within the insulating film. The insulating layer 105 protrudes from an end face of the silicon substrate 101 to provide a protruding portion 109. In other words, the insulating layer 105 comprises the protruding portion 109 that protrudes from the end face of the silicon substrate 101. The interconnects 107 are provided within the protruding portion 109.

The length of the protruding portion 109 from the end face of the silicon substrate 101 may be, for example, equal to or longer than 1 µm, and may preferably be equal to or longer than 2 µm. Having such configuration, generation of defects such as short-circuit of the semiconductor device 100 that is caused by a protruding of the interconnect 107 occurred in the process for manufacturing the semiconductor device 100 can be surely inhibited by performing a dicing process, which will be discussed later. In addition, the distance of the portion of the protruding portion 109 protruding from the end face of the silicon substrate 101 may be set to, for example, equal to or shorter than 5 µm. This configuration provides increasing the degree of integration of the semiconductor device 100 on a silicon wafer. Further, the thickness of the insulating layer 105 may be, for example, on the order of 3 to 10 µm.

While the interconnect 107 is shown as having a tip of the interconnect 107 protruding from a side cross-section of the insulating layer 105 in FIG. 1A and FIG. 1B, it is not necessary to have the protruding portion. When the tip has the protruding portion, the length of the protruding portion of the interconnect 107 may preferably be shorter than the length of the protruding portion 109.

Figure 13:
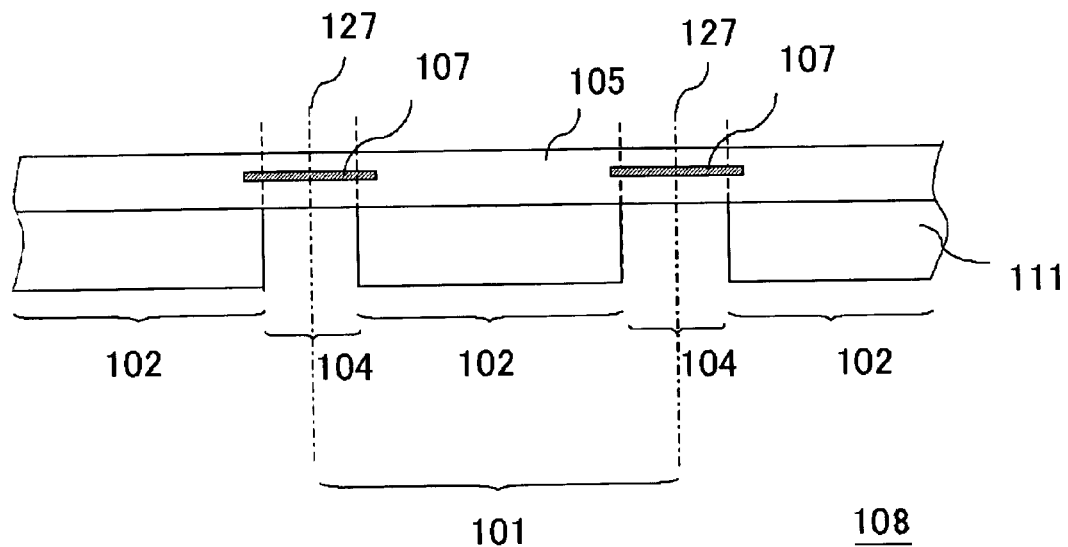
FIG. 13 is a schematic cross sectional view of the semiconductor wafer according to an embodiment.

FIG. 13 is a cross-sectional view, schematically showing a configuration of a semiconductor wafer according to the present embodiment. A semiconductor wafer 108 shown in FIG. 13 has a configuration having an insulating layer 105 provided on a main face of a silicon wafer 111 that is a semiconductor substrate. The semiconductor wafer 108 comprises a plurality of element regions 102 and a plurality of dicing regions 104.

In the case of the semiconductor wafer 108, a silicon wafer 111 is entirely removed in the dicing regions 104 and the silicon wafer 111 is not removed in the regions except the dicing regions 104. Further, the insulating layers 105 are provided in the dicing regions 104. In addition, the interconnects 107 are provided in the dicing regions 104. The interconnects 107 are embedded within the insulating layers 105 in the dicing regions 104, and provide electrical connecting of one of plurality of element regions 102 to the other of plurality of element regions.

In the thus configured semiconductor wafer 108, the dicing regions 104 is broken along the dicing line 127 to provide a plurality of semiconductor devices 100 shown in FIG. 1A and FIG. 1B.

Next, a method for manufacturing the semiconductor device 100 shown in FIG. 1 will be described. Concerning the manufacturing of the semiconductor device 100, a plurality of semiconductor devices 100 are simultaneously formed in one piece of the silicon wafer, and are obtained by performing a dicing process. FIG. 2, FIG. 3A to FIG. 3D, FIG. 4A to FIG. 4D, FIG. 5, FIG. 6 and FIG. 7A to FIG. 7C are schematic views, which are describing the process for manufacturing the semiconductor device 100 according to the present embodiment. Process for manufacturing the semiconductor device 100 will be described as follows in reference to these figures.

Firstly, as shown in FIG. 2, a layer having a predetermined element and an interconnect 107 in a main face of a silicon wafer 111 is formed, and a plurality of element regions 102 and dicing regions 104 that provide partitions of the element regions 102 are arranged. A native oxide film (not shown in the drawings) is formed as a silicon oxide film on the main face of the silicon wafer 111. Thickness of the silicon wafer 111 is set on the order of, for example, 1 mm.

The interconnect 107 is provided within the insulating layer 105, and a portion of the interconnect 107 is formed over a plurality of semiconductor devices 100 and also provides electrical connecting between the semiconductor devices. The insulating layer 105 may have a multilayered interconnect structure having the plurality of interconnect layers. Here in FIG. 2, the upper view represents the configuration of the wafer, and the lower view represents the configuration of the semiconductor device 100 obtained corresponding to the configuration of the wafer.

Next, the silicon wafer 111 is diced. Here, in FIG. 3A to FIG. 3D and FIG. 4A to FIG. 4D, the insulating layer 105 on the silicon wafer 111 is not shown in the drawings. In FIG. 4B and FIG. 4C, the insulating layer 114, which is a portion of the insulating layer 105 provided on the main face of the silicon wafer 111, is shown. Further, in FIG. 3A, the surface of the side, in which the insulating layer 105 of the silicon wafer 111 is provided, that is, the main face 113, is shown.

Figure 3A:
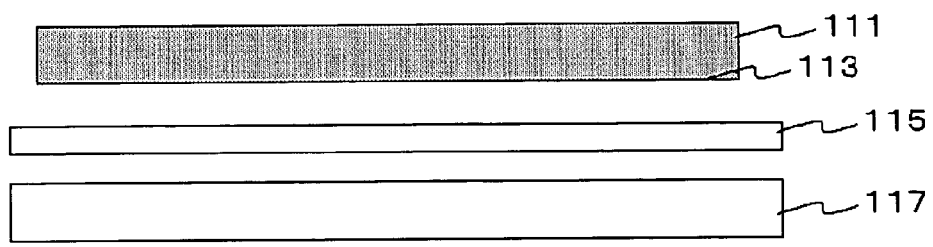
FIGS. 3A to 3D are cross sectional views describing the process for manufacturing the semiconductor device shown in FIG. 1.

Firstly, a pressure-sensitive adhesive tape 115 and a silicon wafer 111 are formed in this order on a support plate 117 that is composed of a glass (FIG. 3A). In this occasion, the main face 113 of the silicon wafer 111 is joined to the pressure-sensitive adhesive tape 115. Then, the silicon wafer 111 and the support plate 117 are pressure-sensitive adhered together via the pressure-sensitive adhesive tape 115 between the silicon wafer 111 and the support plate 117 (dotted line in FIG. 3B).

The pressure-sensitive adhesive tape 115 is composed of a base material and pressure-sensitive adhesive layers formed on both sides of the pressure-sensitive adhesive layers. For example, polyolefin resins, polyester resins or the like, for example, may be employed for the base material composing the pressure-sensitive adhesive tape. More specifically, for example, polyethylene terephthalate may be employed.

The pressure-sensitive adhesive layer is composed of a cured layer provided on one side of the base material and a foam layer provided on the other side of the base material. Acrylic emulsion pressure-sensitive adhesive, acrylic solvent pressure-sensitiveness adhesive, urethane pressure-sensitive adhesive or the like, for example, may be used for a pressure-sensitive adhesive constituting the pressure-sensitive adhesive layer. Light curing materials that are cured by the irradiation of ultra-violet or the like, for example, may be employed for a pressure-sensitive adhesive used in the cured layer. In addition, light removing material that can be foamed by the irradiation of ultra-violet ray or the like to provide removing may be employed for a pressure-sensitive adhesive used in a foam layer. In addition, these materials are selected so as to provide a range of curing wave length for the cured layer that is different from a range of removing wave length for the foam layer.

When the silicon wafer 111 and the support plate 117 are joined, the foamed face of the pressure-sensitive adhesive tape 115 is provided on the side of the silicon wafer 111, and the cured face is provided on the side of the support plate 117.

Further, the support plate 117 may be composed of materials having resistances for heat, chemicals, external force or the like during the process for thinning of the silicon wafer 111, and for example, may be a glass substrate such as quartz substrate, pyrex™ substrate and the like. Alternatively, materials except glass substrate may be employed. For example, a substrate of plastics such as acrylic resins may be used. Breakage occurred by an external force or warpage in the thinning process for the silicon wafer 111, as described later, can be inhibited by fixing the silicon wafer 111 into the support plate 117.

Figure 3B:
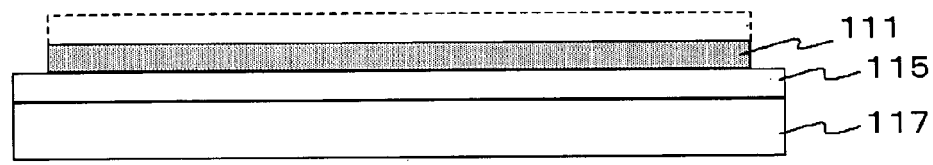

Then, the silicon wafer 111 is thinned by a back grinding (FIG. 3B). The back grinding process is performed by a mechanical polishing. Thickness of the silicon wafer 111 after the back grinding may be suitably selected, and specifically, for example, on the order of 30 to 200 μm, and more specifically, for example, 100 μm.

Figure 3C:
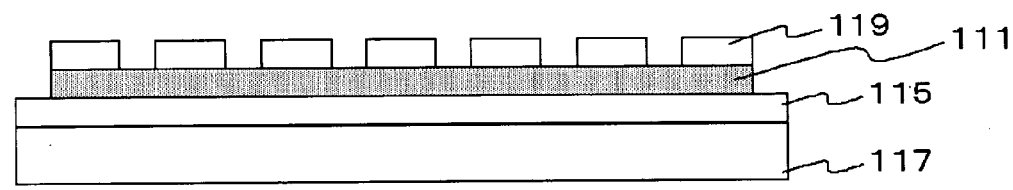

Then, a resist pattern 119 that coats the element regions 102 and has openings, that is, dicing regions 104, are formed on the side of the back face of the silicon wafer 111 (FIG. 3C).

The width of the opening, that is dicing region 104, may be suitably selected corresponding to the length of the protruding portion 109 from the end face of the silicon substrate 101, and, for example, may be designed to be equal to or longer than 2 μm. This enables a stable formation of the projecting portion 109 in the semiconductor device 100.

Further, the width of the dicing region 104 may be, for example, equal to or less than 7 μm, and preferably equal to or less than 5 μm. This enables the miniaturization of the semiconductor device 100. Further, the degree of the integration of the element regions 102 in the silicon substrate 101 may be increased.

Further, the length of the projecting region in the projecting portion 109, that is the distance thereof from the end face of the silicon substrate 101 may be, for example, a length within a range of from one third to two thirds of the width of the dicing region 104, and more specifically, on the order of one second of the width of the dicing region 104. Having such configuration, the contact between the protruded interconnect 107 and the silicon substrate 101 can be avoided, even if the interconnect 107 is protruded from the end face of protruding portion 109.

Figure 3D:
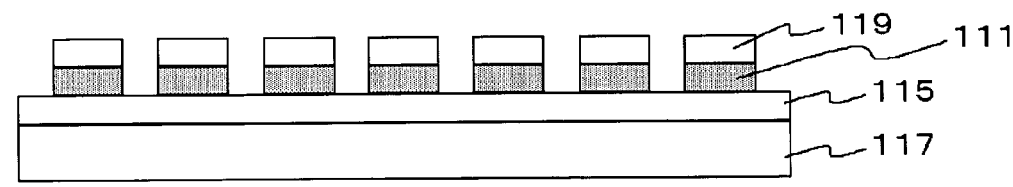

Then, the silicon wafer 111 is selectively removed by an etching using the resist pattern 119 as a mask to provide selective thinning thereto (FIG. 3D). Here, the etching process in this case is carried out under a condition that can provide higher etching selectivity ratio of silicon to the insulating film. The insulating layer 105 is provided on the surface of the silicon wafer 111, and the interconnects 107 are formed in the dicing regions 104 in the insulating layer 105. Therefore, the etching is stopped at the portions in the insulating layer 105 that contains the interconnects 107 (not shown in FIG. 5).

Etching may be performed by using the Bosch method, for example, and may also be carried out while providing a protection of the surface of the wall of the silicon wafer 111 and the resist pattern by forming a protective film. In this case, a simultaneous irradiation of $SF_6$ and $O_2$ and an irradiation of $C_4F_8$ may be alternately implemented to perform an etching.

Figure 5:
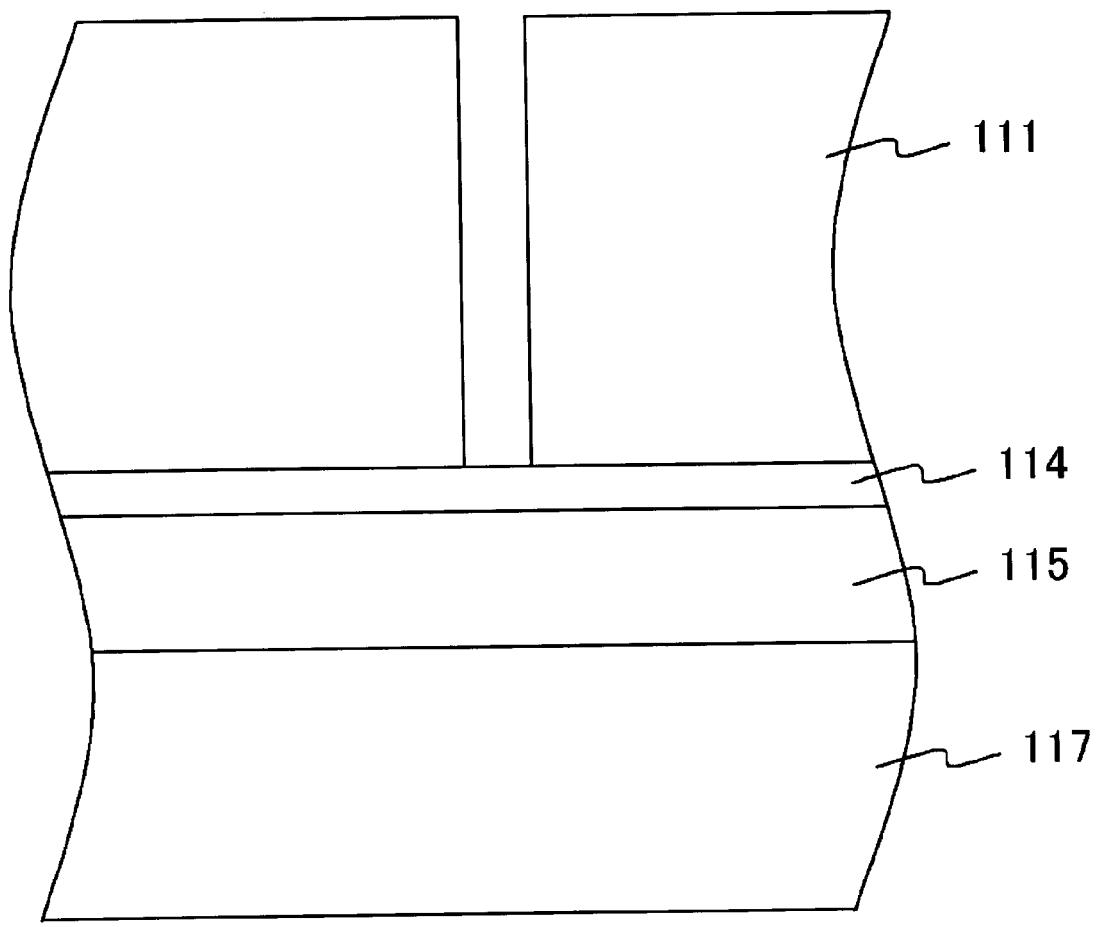
FIG. 5 is a cross sectional view describing the process for manufacturing the semiconductor device shown in FIG. 1.

FIG. 5 is a view of an enlarged sectional portion shown in FIG. 3D. Though it is not shown in FIG. 3D, no through hole is formed in the dicing regions 104 on the side of the main face of the silicon wafer 111, and the insulating layer 114, which is a part of the insulating layer 105 and comprises the interconnect 107 therein, remains, as shown in FIG. 5.

Figure 4A:
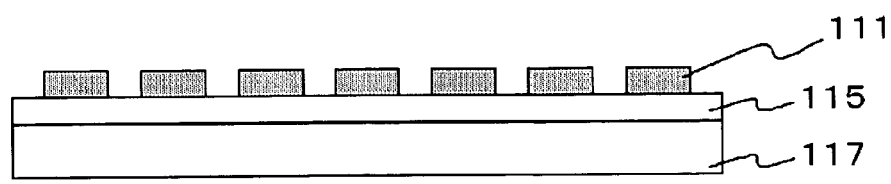
FIGS. 4A to 4D are cross sectional views describing the process for manufacturing the semiconductor device shown in FIG. 1.
Figure 4B:
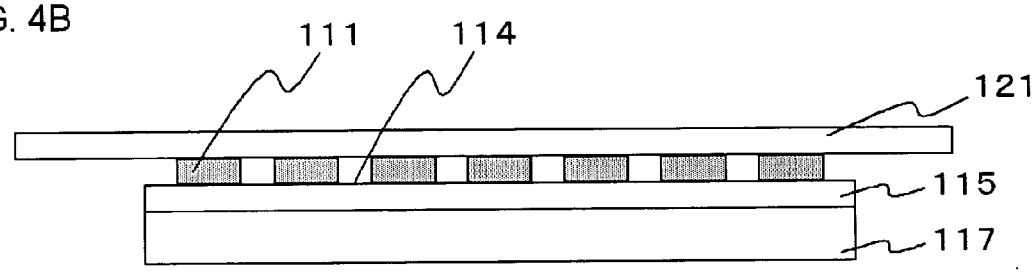
Figure 4C:
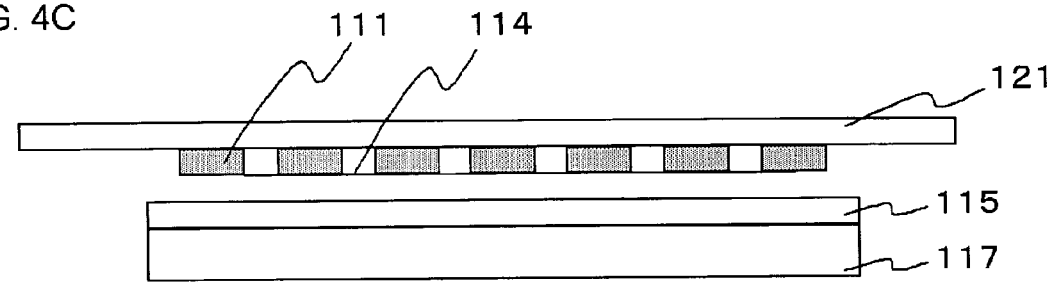

Next, the resist pattern 119 is removed from the back surface of the silicon wafer 111 by dry etching (FIG. 4A). Then the back surface of the silicon wafer 111 is pressure-sensitive adhered to the dicing tape 121 (FIG. 4B).

The dimension of the dicing tape 121 may preferably be equivalent to or larger than that of the silicon wafer 111. Providing such dimension, an end portion of the dicing tape 121 can be disposed away from a periphery portion of the silicon wafer 111 when these are pressure-sensitive adhered. Having such configuration, the silicon wafer 111 can be stably divided into a plurality of semiconductor devices 100 in the process described later in reference to FIG. 6 and FIG. 7A to FIG. 7C.

The dicing tape 121 may be designed to be a tape having the above-mentioned cured layer provided as the pressure-sensitive adhesive layer on one side of a base material. UV curing materials may be employed as the material of the cured layer. Each of the members composing the dicing tape 121 may be, for example, a material that is also capable of utilizing for the members composing the pressure-sensitive adhesive tape 115. The dicing tape 121 may also be composed of a material that is easy to be elongated along the surface orientation. This configuration ensures to provide the separation of the dicing regions 104 described later by a simple and easy method.

Then, the silicon wafers 111 fixed on the dicing tape 121 are removed off from the support plate 117 and the pressure-sensitive adhesive tape 115 (FIG. 4C). Having this process, the silicon wafers 111 are transferred from the support plate 117 to the dicing tape 121. For example, when the pressure-sensitive adhesive tape 115, which can be removed by the ultraviolet irradiation, is employed, the removing is achieved by conducting the light irradiation from the side of the support plate 117. In such status, the silicon wafers 111 have not been divided into a plurality of semiconductor devices 100, due to the presence of the remaining insulating layer 114, and thus remain in the state of integrated members.

Figure 4D:
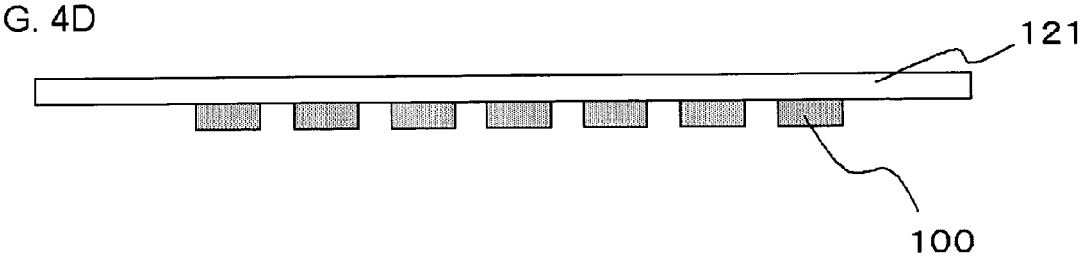

Then, the dicing tape 121 is elongated to apply a stress to the silicon substrates 101, thereby breaking the thinned insulating layer 114 of the element region 102. This provides a status, in which a plurality of semiconductor devices 100 are pressure-sensitive adhered onto the dicing tape 121 (FIG. 4D). The semiconductor devices 100 are removed from the dicing tape 121 to provide the semiconductor device 100 shown in FIG. 1.

Figure 6:
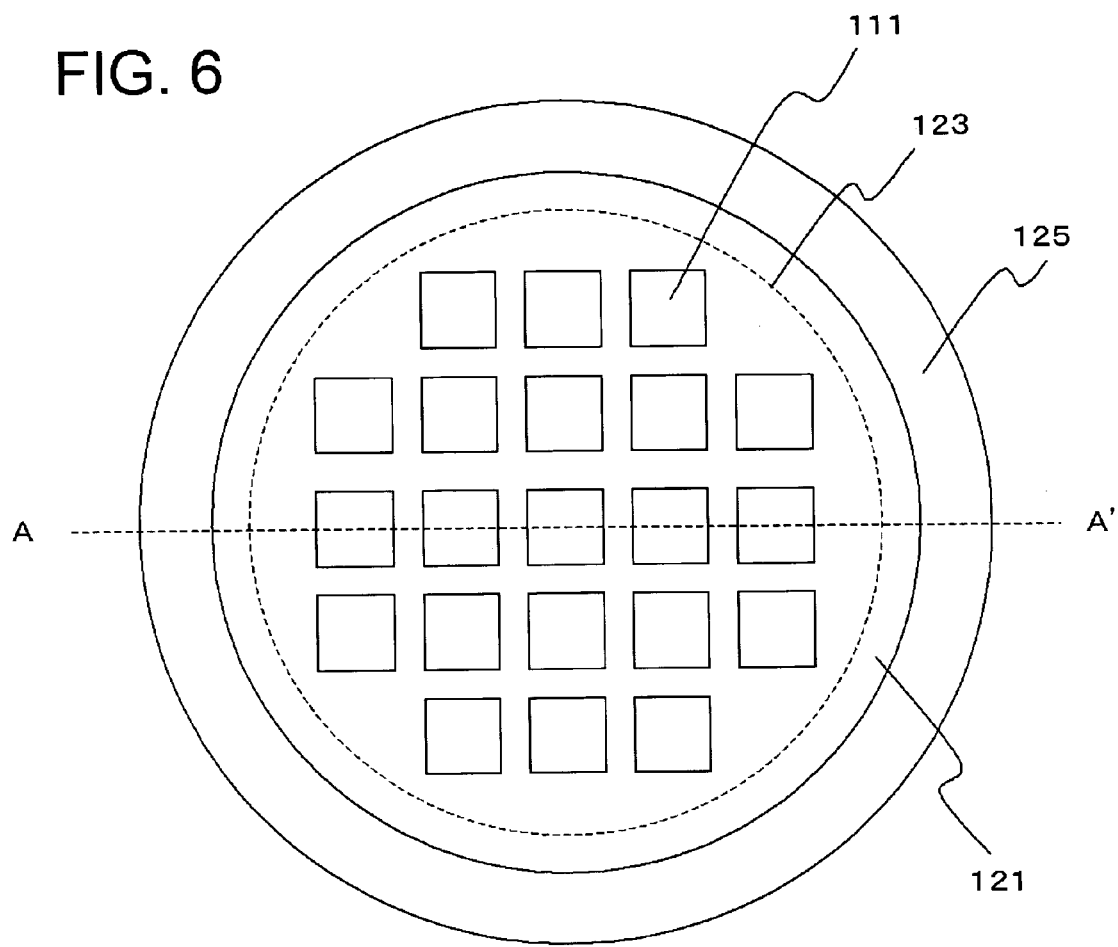
FIG. 6 is a plan view describing the process for manufacturing the semiconductor device shown in FIG. 1.
Figure 7A:
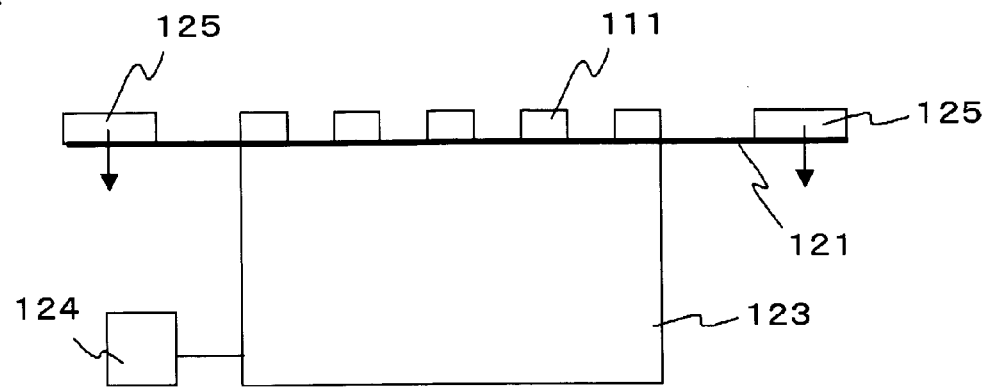
FIGS. 7A to 7C are cross sectional views describing the process for manufacturing the semiconductor device shown in FIG. 1.
Figure 7B:
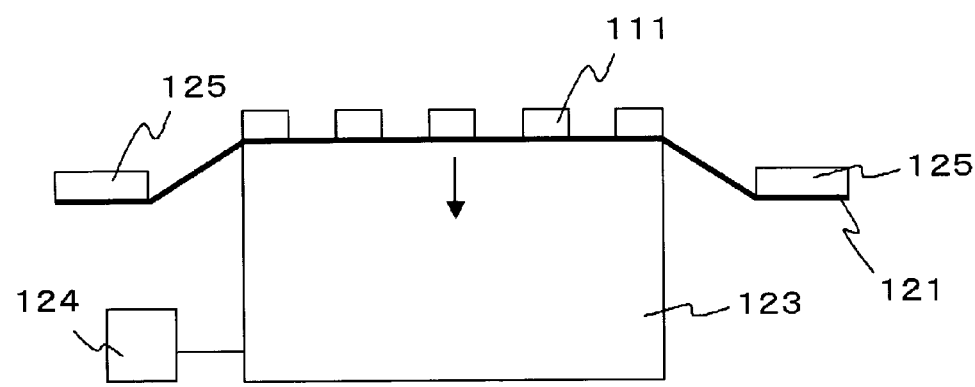
Figure 7C:
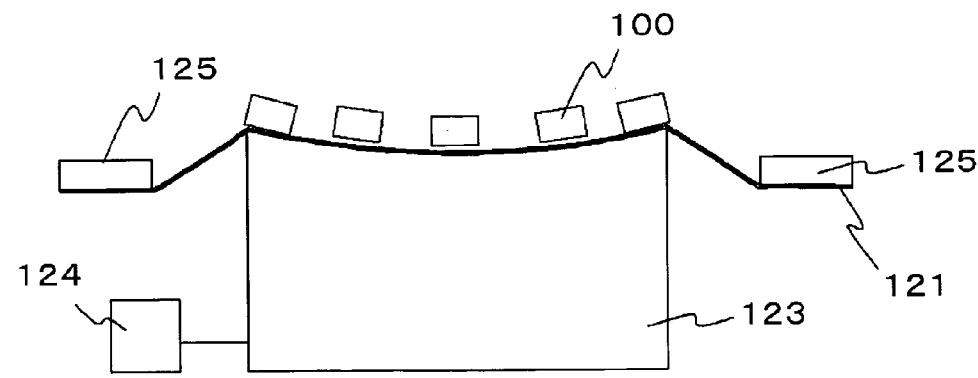

FIG. 6 and FIG. 7A to FIG. 7C are schematic views, schematically showing the process for cutting the silicon wafer 111 off at the dicing regions 104 to divide the silicon wafer 111 into a plurality of semiconductor devices 100. FIG. 6 is a plan view, schematically showing a situation where the silicon wafer 111 is installed in the dicing device. FIG. 7A to FIG. 7C are cross-sectional views along A–A' line in FIG. 6. The method for dicing the silicon wafer 111 will be described as follows in reference to these views.

At first, a joined body of the silicon wafer 111 and the dicing tape 121 is substantially horizontally installed on a stage 123. A face that is on opposite side of an interface between the dicing tape 121 and the silicon wafer 111 is brought into contact with a surface of the stage 123. A cross section area of the stage 123 is smaller than a cross section area of the dicing tape 121. Further, the stage 123 is connected to a pump 124 to provide a configuration of being capable of depressurizing the interior of the stage 123. Further, the upper surface of the stage 123 has an opening. Further, a suppression ring 125 is provided on the periphery portion of the dicing tape 121 (FIG. 6 and FIG. 7A). The suppression ring 125 may be made of, for example, a metal plate having a tubular shape.

Next, as indicated by an arrow in FIG. 7A, the suppression ring 125 is pushed down toward the vertically lower direction (FIG. 7B). In this occasion, the dicing tape 121 having the silicon wafers 111 pressure-sensitive adhered on the dicing tape 121 is mounted on the stage 123, and therefore no warpage is occurred on the surfaces of the silicon wafers 111.

Next, as indicated by an arrow in FIG. 7B, the pump 124 is actuated to depressurize the interior of the stage 123. Since the opening (not shown in the drawings) is provided on the upper face of the stage 123, a force toward the inside of the stage 123 is exerted on the dicing tape 121 on the stage 123, due to the depressurizing. Therefore, the bottom face of the dicing tape 121 bends into a concave-shape and is stretched. In this case, a force is exerted on the silicon wafers 111 pressure-sensitive adhered onto the dicing tape 121, and thus the silicon wafers 111, which have been integrated members, are broken at the thinned insulating layers 114. In this occasion, the interconnects 107 embedded within the insulating layer 114 in the dicing region 104 are also mechanically broken. As such, one piece of the silicon wafer 111 is divided into a plurality of semiconductor devices 100 (FIG. 7C).

Then, the divided chips are removed from the dicing tape 121 to obtain the semiconductor devices 100 shown in FIG. 1.

Next, the advantageous effects obtainable by the semiconductor device 100 will be described.

In the semiconductor device 100, the protruding portion 109 that protruded from the insulating layer 105 is formed in the periphery edge of the silicon substrate 101. Further, the configuration having the interconnects 107 exposed at the end faces of the insulating layer 105 is provided. Since the protruding portion 109 is formed, the contact between the protruded interconnect 107 and the semiconductor substrate 101 can be avoided, even if the interconnects 107 are stretched in the dicing process (FIG. 7C) in the manufacturing to be protruded from the end face of the silicon substrate 101. Therefore, the configuration of providing the semiconductor device having improved reliability can be obtained. Further, the manufacture of the semiconductor device by the simple process can be achieved, and better production yield in the manufacturing of the semiconductor device can be presented. These advantageous effects may be considerably exhibited when the material of the interconnect 107 is a metal having comparatively smaller hardness such as Cu or Al or the like.

Further, the semiconductor device 100 is manufactured by the process including selective etching the silicon wafer 111 after performing the back grinding, partially removing the silicon wafer 111 and transferring of the silicon wafer 111 to the dicing tape 121. Therefore, although the configuration includes the interconnect 107 embedded within the insulating layer 105 of the dicing region 104, the silicon wafer 111 can easily be divided into a plurality of semiconductor devices 100 by exerting a mechanical force to the silicon wafer 111. Thus, the configuration provides inhibiting the generation of ground portions in the dicing process in the manufacture of the semiconductor device 100, and thus presents improved manufacturing stability.

The configuration of the semiconductor device 100 according to the present embodiment can preferably be applied to, for example, micro computers containing smaller-sized chips and the like. Since such chip is difficult to be contacted with a probe of a tester during the reliability test, the test may often be conducted by providing electrical connecting between the plurality of chips and then measuring the reliability with bonding pads. In this case, contact between the interconnect protruded from the diced end face and the silicon substrate 101 can be avoided by providing the protruding portion 109.

Figure 8A:
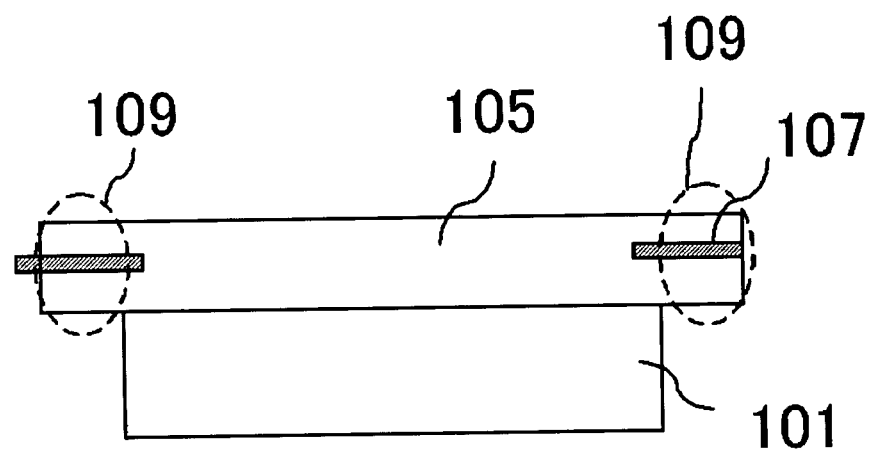
FIG. 8A is a cross sectional view of the semiconductor device 100 according to the first embodiment.
Figure 8B:
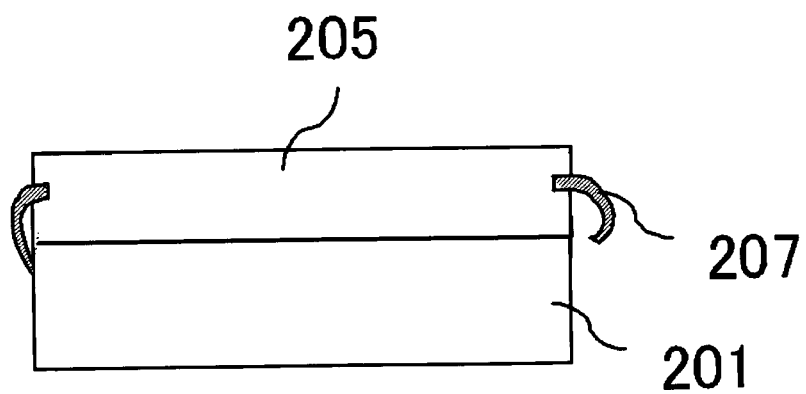
FIG. 8B is a cross sectional view of a conventional semiconductor device.

Next, the semiconductor device 100 according to the present embodiment (FIG. 1) will be further described by focusing on the comparison thereof with the conventional semiconductor device. FIG. 8A and FIG. 8B are cross sectional views, schematically showing the semiconductor device 100 according to the present embodiment and a conventional semiconductor device, respectively.

As shown in FIG. 8B, the conventional semiconductor device includes an insulating layer 205, which has no protruded portion from an end face of a silicon substrate 201. Therefore, when the interconnect 207 is formed at the cut face, the interconnect is exposed at the end face to generate easy contact with the silicon substrate 201. Further, when the interconnect 207 exists in the dicing region, it has been difficult to obtain the conventional semiconductor devices by etching with the conventional technique. Further, when the conventional semiconductor device is obtained from the silicon wafer by the dicing process, the end portion of the interconnect 207 is easily stretched to be protruded in the dicing process. In this occasion, in the conventional configuration where the positions of the insulating layer 205 and the end face of the silicon substrate 201 are aligned, the interconnect portion of the interconnect 207 is easily to come in contact with the silicon substrate 201 as shown in FIG. 8B. Therefore, there is a concern that the defect such as generation of leakage current may be occurred.

On the contrary, since the semiconductor device 100 according to the present embodiment comprises the insulating layer 105 that protrudes further than the silicon substrate 101 as shown in FIG. 8A, the configuration provides that the interconnect 107 is not easily be come into contact with the silicon substrate 101 even if the end portion of the interconnect 107 is protruded. While the illustration of FIG. 8A corresponds to the illustration of FIG. 1A, and more specifically, the configuration is illustrated where the interconnect 107 provided in the protruding portion 109 shown in the left side in the drawing protrudes from the end face of the insulating layer 105 and the interconnect 107 provided in the protruding portion 109 shown in the right side in the drawing does not protrude from the end face of the insulating layer 105, the presence of the protruding portion of the interconnect 107 is not particularly limited. Further, while it is difficult in the convention technique to divide the wafer into the semiconductor devices 100 by etching when the interconnect 107 is disposed in the dicing region 104, the semiconductor device 100 of the present embodiment can be obtained by stretching the dicing tape 121 to break the dicing region 104 after partially removing the silicon wafer 111, and thereby presenting the configuration providing improved manufacturing easiness.

In the present embodiment, the cutting process of the dicing region 104 is not limited to the above-described process illustrated in reference to FIG. 6 and FIG. 7A to FIG. 7C. The silicon wafer 111 may be also cut off to obtain the semiconductor devices 100 by stretching or bending the dicing tape 121 along the surface direction by other process.

While the configuration, in which the protruding portion 109 is formed across the entire end face of the semiconductor substrate 101 in the present embodiment is exemplified, it is sufficient that the semiconductor device 100 may have the protruding portion 109 at least in the region where the interconnect 107 is exposed on the end face of the insulating layer 105. By providing the protruding portion 109 on the entire surface of the silicon substrate 101, the dicing process can be more surely carried out, thereby providing the considerably improved manufacturing stability.

(Second Embodiment)

Figure 14:
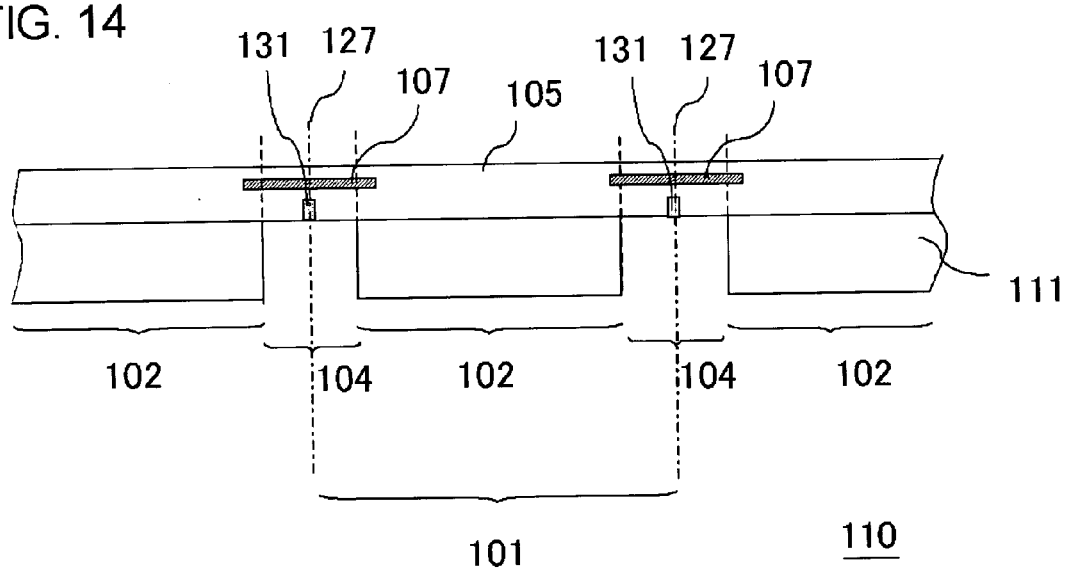
FIG. 14 is a schematic cross sectional view of the semiconductor wafer according to an embodiment.

The present embodiment will illustrate another example of a semiconductor wafer for obtaining the semiconductor device 100 shown in FIG. 1. FIG. 14 is a cross sectional view, schematically showing a configuration of a semiconductor wafer according to a second embodiment. Basic configuration of a semiconductor wafer 110 shown in FIG. 14 is substantially similar to that of the semiconductor wafer shown in FIG. 13 described in the first embodiment, and is different in the point that plugs for dicing 131 are disposed within the insulating layers 105 in the dicing regions 104. The present embodiment will be described as follows mainly on the point that is different from the first embodiment.

In the semiconductor wafer 110 shown in FIG. 14, plugs for dicing 131 are embedded within the insulating layer 105 in the dicing regions 104. In FIG. 14, the plugs for dicing 131 are disposed in a side closer to the main face of the silicon wafer 111 than the interconnect 107. Further in FIG. 14, the interconnects 107 are disposed along the dicing line 127.

In the semiconductor wafer 110, the plugs for dicing 131 are provided in the dicing regions 104. Thus, breakage is occurred from a starting point at the plug for dicing 131 in the dicing process. Accordingly, the configuration achieves performing the dicing process more easily than the configuration of the semiconductor wafer 108 shown in FIG. 13.

Further, the position for performing the dicing can be adjusted by suitably selecting the distance from the end of the element region 102 to the plug for dicing 131 to dispose the plug for dicing 131. Thus, the configuration of the semiconductor wafer 110 provides that, when the semiconductor wafer 110 is divided into the semiconductor devices 100, the length of the protruding portion 109 of semiconductor device 100 can be adjusted corresponding to the distance from the end of the element region 102 to the plug for dicing 131. Thus, the configuration described above can provide further surely inhibiting a contact between the interconnects 107 exposed in the dicing process and the silicon substrate 101 of the semiconductor device 100.

Next, an arrangement of the plugs for dicing 131 in dicing regions 104 in the semiconductor wafer 110 will be described in further detail.

Figure 9:
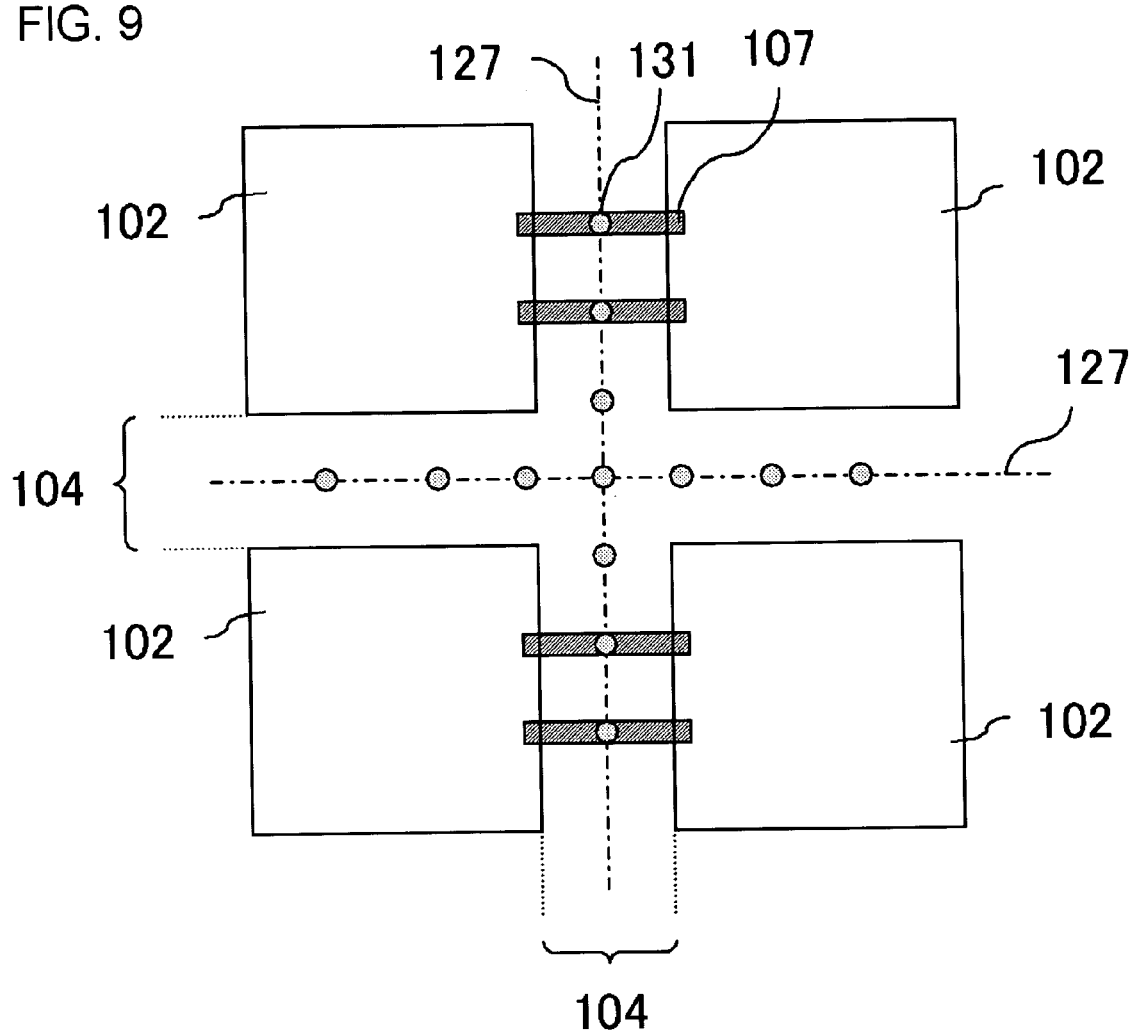
FIG. 9 is a schematic plan view of a semiconductor wafer according to a second embodiment.

FIG. 9 is a plan view, schematically showing a configuration of a plurality of element regions 102 formed in the silicon wafer 111 and a portion of the dicing region 104 for separating thereof. As shown in FIG. 9, the plugs for dicing 131 may be formed to be aligned on the dicing line 127. The plug for dicing 131 may be provided in any layer in the insulating layer 105 having an insulating film formed is in the insulating layer 105, and may be formed with a predetermined process corresponding to the design of the semiconductor devices 100 that are obtained by the dividing process.

Further, the shape of the plug for dicing 131 is not particularly limited, and any columns such as cylinder, elliptic cylinder, square column and the like may be employed, and in addition, a shape same as that of a connecting plug formed in the element region 102 may also be employed. Having such configuration, since the plugs for dicing 131 are formed as isolation plugs in the element region 102 simultaneously with forming the connecting plug within the insulating layer 105, the length of the protruding region in the protruding portion 109 can be surely adjusted without the need for providing an additional process.

The silicon wafer 111 shown in FIG. 9 is cut off along the dicing line 127 in the width-center portion of the dicing region 104 to provide the semiconductor devices 100 having the shape, in which a portion of the dicing region 104 remains in the periphery of the element region 102. By providing the plugs for dicing 131 along the dicing line 127, when the silicon wafer 111 provided the insulating layer 105 having the interconnect 107 is divided, the breaking can surely be carried out in vicinity of the plug for dicing 131. Therefore, the width of the dicing region 104 remaining outside of the element region 102 can be adjusted so as to match the width of the dicing region 104 with a dimension on the order of a distance from the element region 102 to the plug for dicing 131. Thus, the length of the protruding portion 109 of semiconductor device 100 formed by the dicing process from the end face of the silicon substrate 101 can be surely adjusted.

Here, as shown in FIG. 9, the interconnect 107 can be more surely broken by forming the plugs for dicing 131, which are provided along the dicing line 127, on the interconnects 107.

Figure 10:
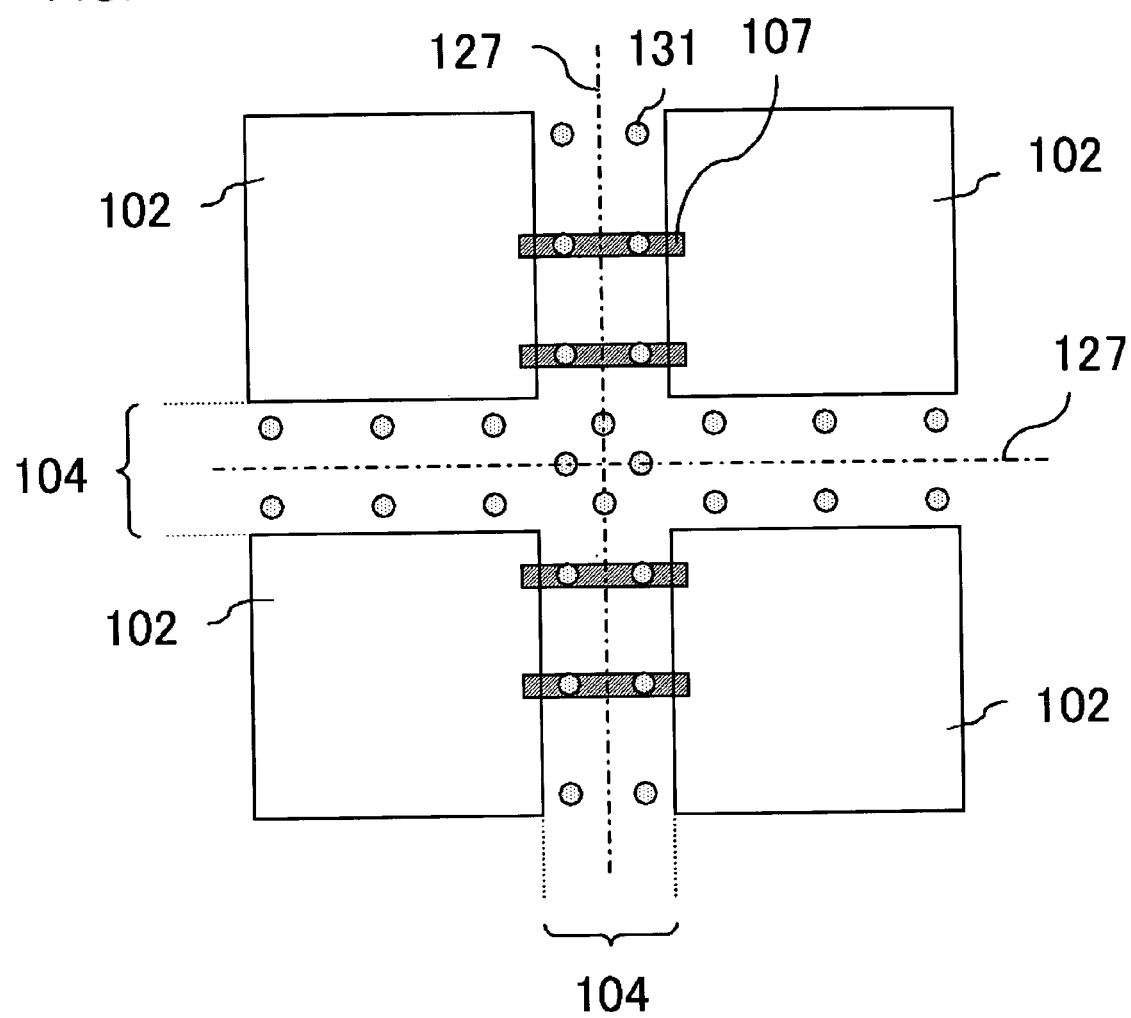
FIG. 10 is a schematic plan view of a semiconductor wafer according to the second embodiment.
Figure 11:
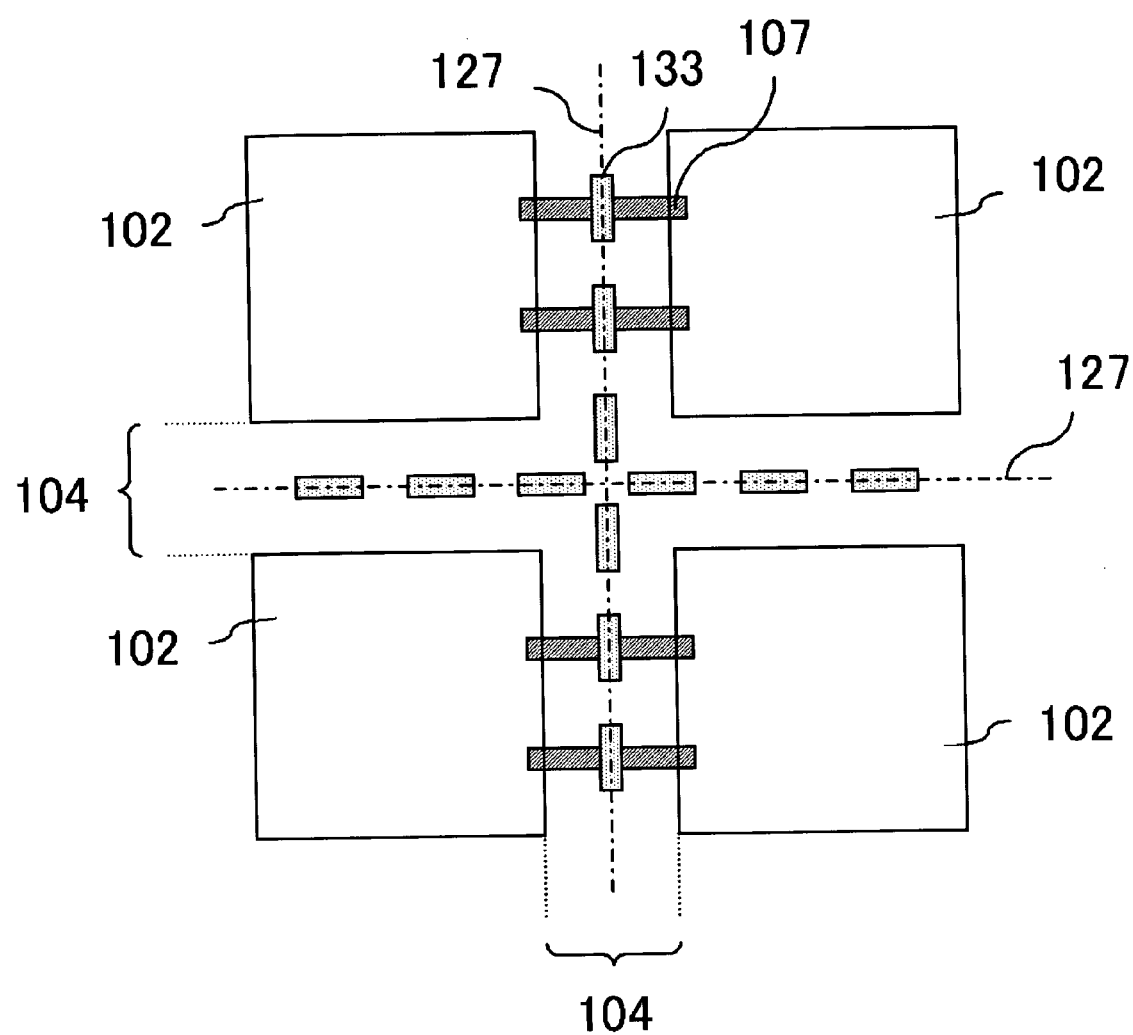
FIG. 11 is a schematic plan view of a semiconductor wafer according to the second embodiment.
Figure 12:
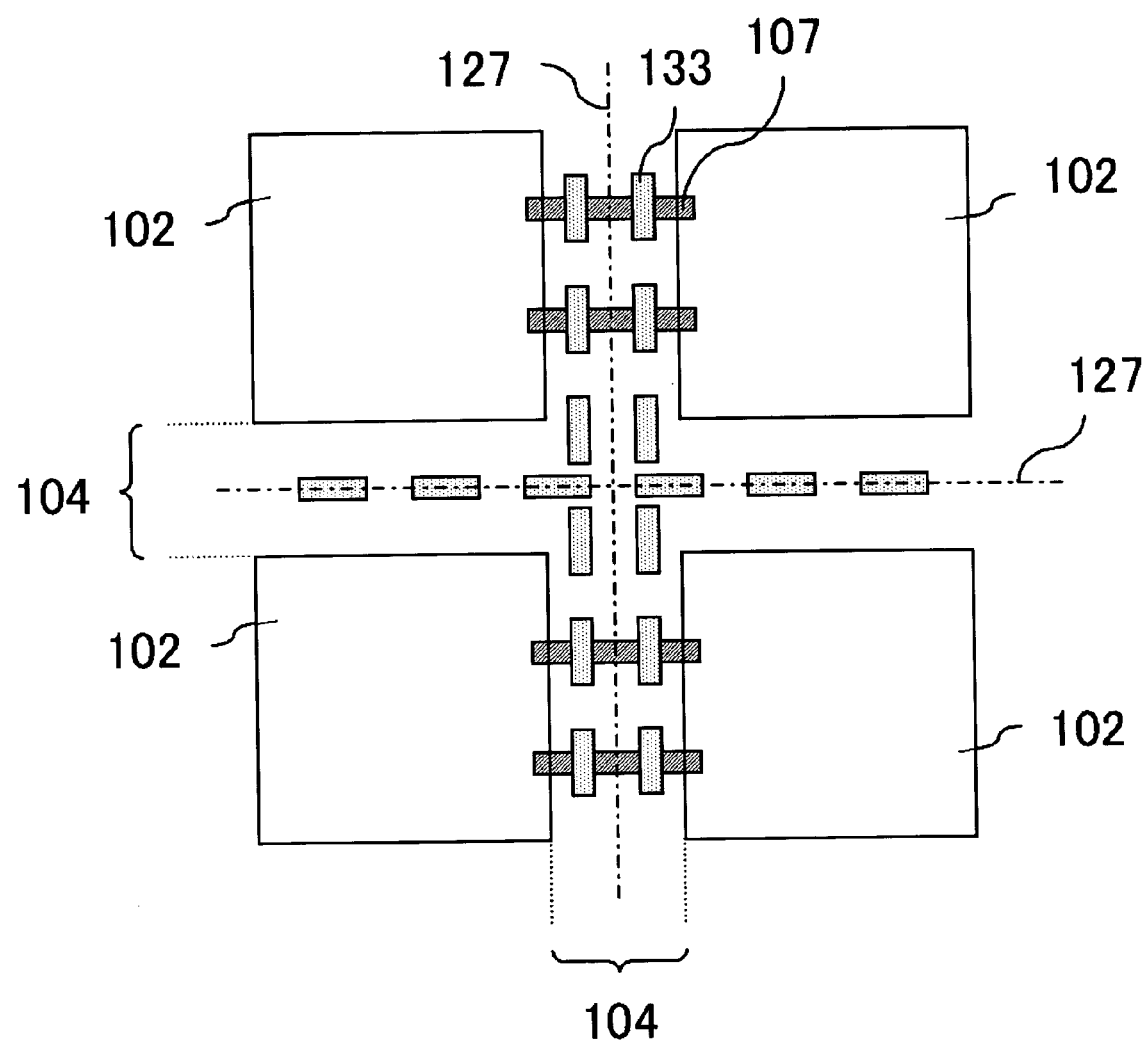
FIG. 12 is a schematic plan view of a semiconductor wafer according to the second embodiment.

FIG. 10 to FIG. 12 are views, illustrating another configuration of the silicon wafer 111, which is suitable for adjusting the protruding portion 109. FIG. 10 is a view, showing a configuration of the silicon wafer 111 provided with the plugs for dicing 131 that are arranged in parallel two lines in the dicing line 127. As shown in FIG. 10, by arranging the line of plurality of the plugs for dicing 131 in the dicing region 104, the lengths of the protruding portions 109, which is formed in the plurality of semiconductor devices 100 by dividing the adjacent element regions 102, from the end face of the silicon substrate 101 can be respectively adjusted to more surely provide predetermined lengths.

FIG. 11 illustrates an example for providing the stripe-shaped plugs for dicing 133 on the dicing line 127. The dicing can be more surely conducted even for the silicon wafer 111 having the interconnects 107 provided in the dicing region 104, by disposing the stripe-shaped column bodies disposing along an elongation direction of the dicing line 127.

FIG. 12 is also an example, which has the stripe-shaped plugs for dicing 133 arranged in dual lines in the dicing region 104 having the interconnects 107. Having such configuration, the region having the interconnect 107 within the dicing region 104 can be more surely diced. Further, the lengths of protruding portions 109 protruding from the end face of the silicon substrate 101 can be adjusted to more surely provide predetermined lengths.

The embodiments according to the present invention have been described above. However, it is needless to note that the present invention is not limited to the disclosures of the aforementioned embodiments, and a person having ordinary skills in the art can suitably modify the aforementioned embodiments without departing from the scope of the present invention.

For example, while the silicon substrate is employed as the semiconductor substrate in the above-described embodiments, compound semiconductor substrates such as GaAs substrate or the like may also be employed.

Further, while Cu is used for the interconnect 107 in the above-described embodiments, other kinds of metals having high electric conductivity may be used. For example, metals such as Al, Ni, W and the like may be employed. In addition, the width of the interconnect 107 may be thinned in vicinity of the dicing line 127 than other region. This further ensures cutting the interconnect 107 off.

EXAMPLE

In this example, the method described in the first embodiment was employed to manufacture the semiconductor device 100 having the protruding portion 109 (FIG. 1). The thickness of the silicon wafer 111 before performing the back grinding was set to 1 mm, and the thickness of the silicon wafer 111 after the back grinding was set to 200 μm. In addition, "SELFA", commercially available from Sekisui Chemical Co. Ltd. and "Adwill-D", commercially available from LINTEC Corporation were employed for the pressure-sensitive adhesive tape 115 and the dicing tape 121, respectively. The material for the interconnect 107 was Cu.

The dicing process was conducted with a width of the dicing region 104 as 5 μm to obtain the semiconductor devices 100 having the protruding portions 109 protruded by 2 μm in the average from the end face of the silicon substrate 101. Although the Cu interconnect in the protruding portion 109 partially protruded from the end face of the insulating layer 105, the Cu interconnect did not contact to the silicon substrate 110. Having such configuration, the semiconductor device 100 having the configuration, in which the interconnect 107 did not contact to the silicon substrate 101, was obtained with the simple and easy process by employing the method according to the present invention.

It is apparent that the present invention is not limited to the above embodiment, that may be modified and changed without departing from the scope and spirit of the invention.

What is claimed is:

1. A semiconductor wafer comprising:
    a semiconductor substrate; and
    an insulating film provided on a main face of said semiconductor substrate,
    wherein a plurality of element regions and a dicing region are provided on said main face, said dicing region providing an isolation between said plurality of element regions and comprising an interconnect that connects one element region with other element region, and
    wherein said semiconductor substrate is removed on said dicing region and said dicing region comprises at least a portion of said insulating film,
    wherein a conductive plug is provided in said insulating film in said dicing region.

2. The semiconductor wafer according to claim 1, wherein plurality of said conductive plug are provided to form an array along said dicing region.

3. The semiconductor wafer according to claim 1, wherein a width of said dicing region is equal to or larger than 2 μm.

4. A semiconductor chip, wherein said semiconductor chip is provided by dividing said semiconductor wafer according to claim 1 in said dicing region.

5. A semiconductor chip, comprising:
    a semiconductor substrate; and
    an insulating film provided on said main face of said semiconductor substrate,
    wherein said insulating film includes a protruding portion, which protrudes toward outside beyond a periphery edge of said semiconductor substrate,
    wherein an interconnect is included within an interior of said protruding portion,
    wherein a conductive plug is provided within an interior of said protruding portion.

6. The semiconductor chip according to claim 5, wherein said protruding portion protrudes from said periphery edge of said semiconductor substrate by equal to or larger than 1 μm.

7. A method for manufacturing a semiconductor wafer, comprising:
    forming an interconnect layer on a main face of a semiconductor substrate, said interconnect layer including an interconnect and an insulating film, and said interconnect being embedded within said insulating film and connecting one element region to another element region;
    fixing the side of said main face of said semiconductor substrate onto a support substrate; and
    selectively thinning a predetermined region within a region that said interconnect is provided from a side of a back surface of said semiconductor substrate while the side of said main face of said semiconductor substrate is fixed onto the support substrate to form a dicing region, wherein said forming said interconnect layer further includes embedding a conductive plug within said insulating film in said dicing region.

8. A method for manufacturing a semiconductor wafer, comprising:
    forming an interconnect layer on a main face of a semiconductor substrate, said interconnect layer including an interconnect and an insulating film, and said interconnect being embedded within said insulating film;
    fixing the side of said main face of said semiconductor substrate onto a support substrate; and selectively thinning a predetermined region within a region that said interconnect is provided from a side of a back surface of said semiconductor substrate while the side of said main face of said semiconductor substrate is fixed onto the support substrate to form a dicing region, wherein said forming said interconnect layer further includes embedding a conductive plug within said insulating film in said dicing region.

9. The method according to claim 8, wherein said embedding said conductive plug further includes forming plurality of said conductive plug along said dicing region.

10. A method for manufacturing a semiconductor chip, comprising: providing a semiconductor wafer by:

forming an interconnect layer on a main face of a semiconductor substrate, said interconnect layer including an interconnect and an insulating film, and said interconnect being embedded within said insulating film;

fixing the side of said main face of said semiconductor substrate onto a support substrate; and selectively thinning a predetermined region within a region that said interconnect is provided from a side of a back surface of said semiconductor substrate while the side of said main face of said semiconductor substrate is fixed onto the support substrate to form a dicing region; and joining said back surface of said semiconductor substrate to a dicing sheet;

removing said support substrate from said main face of said semiconductor substrate that is joined to said dicing sheet; and dividing said semiconductor wafer into a plurality of semiconductor chips by exerting stress to said semiconductor wafer to break said semiconductor wafer in said dicing region.

11. The method according to claim 7, wherein said embedding said conductive plug further includes forming a plurality of said conductive plug along said dicing region.

12. A method for manufacturing a semiconductor chip, comprising:

providing a semiconductor wafer by the method for manufacturing the semiconductor wafer according to claim 7;

joining said back surface of said semiconductor substrate to a dicing sheet;

removing said support substrate from said main face of said semiconductor substrate that is joined to said dicing sheet; and dividing said semiconductor wafer into a plurality of semiconductor chips by exerting stress to said semiconductor wafer to break said semiconductor wafer in said dicing region.

* * * * *